United States Patent
Shibata

(10) Patent No.: US 10,049,749 B2
(45) Date of Patent: *Aug. 14, 2018

(54) TWO-LEVEL AND MULTI-LEVEL DATA STORAGE SEMICONDUCTOR MEMORY DEVICE

(71) Applicant: TOSHIBA MEMORY CORPORATION, Minato-ku, Tokyo (JP)

(72) Inventor: Noboru Shibata, Kawasaki (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/918,036

(22) Filed: Oct. 20, 2015

(65) Prior Publication Data

US 2016/0042800 A1 Feb. 11, 2016

Related U.S. Application Data

(63) Continuation of application No. 14/023,187, filed on Sep. 10, 2013, now Pat. No. 9,190,161.

(30) Foreign Application Priority Data

Feb. 18, 2013 (JP) ................. 2013-029342

(51) Int. Cl.
  *G11C 7/00* (2006.01)
  *G11C 16/26* (2006.01)
  (Continued)

(52) U.S. Cl.
  CPC ............ *G11C 16/26* (2013.01); *G11C 11/56* (2013.01); *G11C 11/5642* (2013.01); *G11C 16/0483* (2013.01)

(58) Field of Classification Search
  USPC ............ 365/185.03, 185.09, 185.12, 185.17, 365/185.18, 185.21, 185.22, 185.24,
  (Continued)

(56) References Cited

U.S. PATENT DOCUMENTS 8,059,463 B2 11/2011 Murin et al.
8,456,919 B1 6/2013 Jeon et al.
(Continued)

FOREIGN PATENT DOCUMENTS

JP 2011165301 A 8/2011
JP 2011258289 A 12/2011
(Continued)

OTHER PUBLICATIONS

Japanese Office Action (and English translation thereof) dated Sep. 29, 2015, issued in counterpart Japanese Application No. 2013-029342.

(Continued)

*Primary Examiner* — Anthan Tran
(74) *Attorney, Agent, or Firm* — Holtz, Holtz & Volek PC

(57) ABSTRACT

A semiconductor includes a memory cell, a bit line, a word line, a sense amplifier, and a control circuit. The memory cell stores n levels (where n is a natural number of two or greater). The control circuit controls potentials of the word line and the bit line. In a read of k−1 levels (k≤n) stored in the memory cell, the control circuit, upon applying a given voltage to the word line, determines read data based on first data corresponding to the voltage of the bit line read at a first timing by the sense amplifier and second data corresponding to the voltage of the bit line read, by the sense amplifier, at a second timing different from the first timing.

14 Claims, 15 Drawing Sheets

(51) Int. Cl.
*G11C 11/56* (2006.01)
*G11C 16/04* (2006.01)

(58) Field of Classification Search
USPC .................................. 365/185.29, 185.33
See application file for complete search history.

(56) References Cited

U.S. PATENT DOCUMENTS

| | | | |
|---|---|---|---|
| 8,482,976 | B2 | 7/2013 | Shibata |
| 8,498,152 | B2 | 7/2013 | Alrod et al. |
| 8,576,622 | B2 | 11/2013 | Yoon et al. |
| 8,760,929 | B2 | 6/2014 | Yang |
| 8,873,285 | B2 | 10/2014 | Sharon et al. |
| 9,036,415 | B2* | 5/2015 | Sharon ................ G06F 11/1072 365/185.17 |
| 2006/0126392 | A1 | 6/2006 | Shibata |
| 2006/0279993 | A1 | 12/2006 | Shibata |
| 2007/0279982 | A1 | 12/2007 | Shibata et al. |
| 2008/0055990 | A1 | 3/2008 | Ishikawa et al. |
| 2008/0313387 | A1 | 12/2008 | Shibata |
| 2009/0080265 | A1* | 3/2009 | Mokhlesi ................ G11C 7/12 365/185.23 |
| 2011/0075485 | A1 | 3/2011 | Fukuda et al. |
| 2011/0090740 | A1* | 4/2011 | Lee ........................ G11C 16/10 365/185.18 |
| 2011/0197015 | A1 | 8/2011 | Chae et al. |
| 2011/0305089 | A1 | 12/2011 | Abe et al. |
| 2012/0268994 | A1 | 10/2012 | Nagashima |
| 2013/0117635 | A1* | 5/2013 | Ok ........................ G06F 11/1048 714/773 |
| 2013/0215687 | A1* | 8/2013 | Chen .................... G11C 29/021 365/189.11 |

FOREIGN PATENT DOCUMENTS

| | | |
|---|---|---|
| JP | 2012113809 A | 6/2012 |
| WO | 2012097136 A2 | 7/2012 |

OTHER PUBLICATIONS

Japanese Office Action (and English translation thereof) dated Jun. 23, 2015, issued in counterpart Japanese Application No. 2013-029342.

Japanese Office Action (and English translation thereof) dated Mar. 29, 2016, issued in counterpart Japanese Application No. 2013-029342.

* cited by examiner

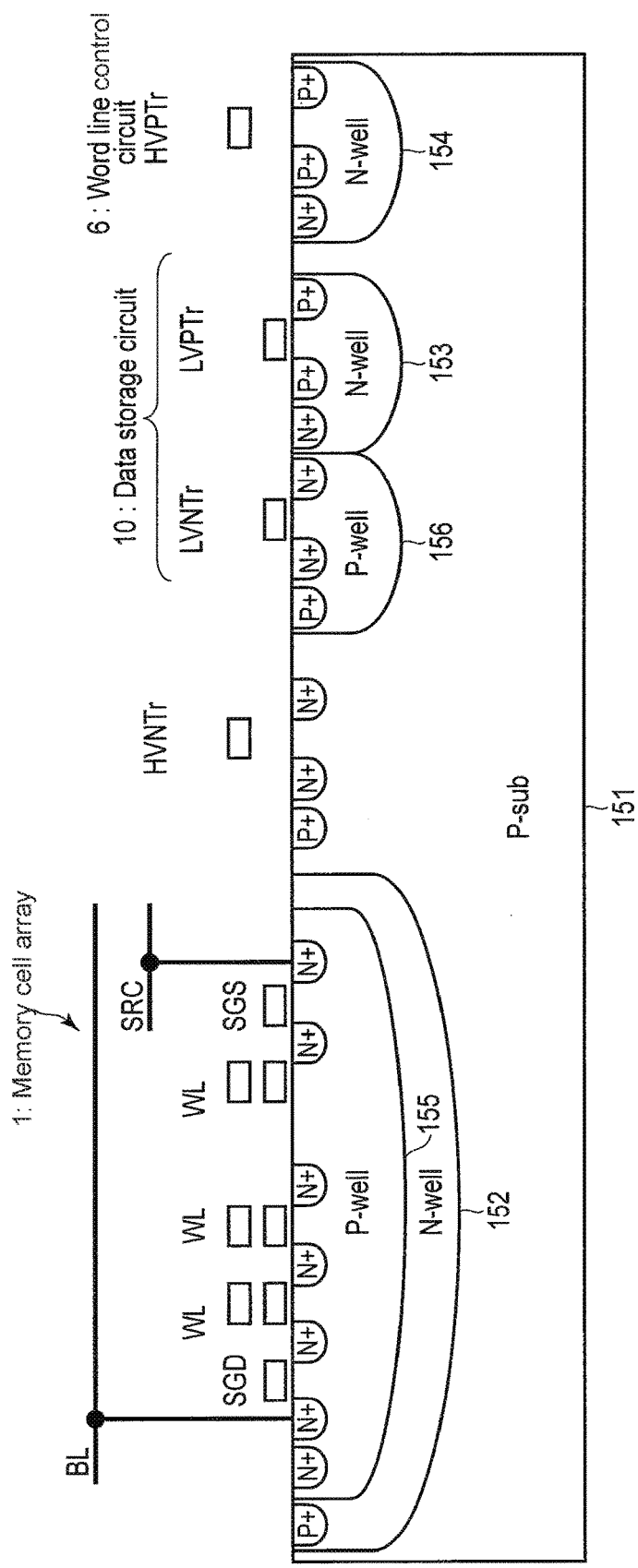
F I G. 5

|  | Memory cell array | | HVNTr(P-sub) | LVNTr (P-well) | LVPTr (N-well) | HVPTr (N-well) |
|---|---|---|---|---|---|---|
|  | (P-Well) | (N-Well) | | | | |
| Erase | Vera(20V) | Vera(20V) | Vss(0V) | Vss(0V) | Vdd(2.5V) | Vdd(2.5V) |
| Program | Vss(0V) | Vss(0V) | Vss(0V) | Vss(0V) | Vdd(2.5V) | Vdd(2.5V)/Vpgmh |
| Read | Vss(0V) | Vss(0V) | Vss(0V) | Vss(0V) | Vdd(2.5V) | Vdd(2.5V)/Vreadh |

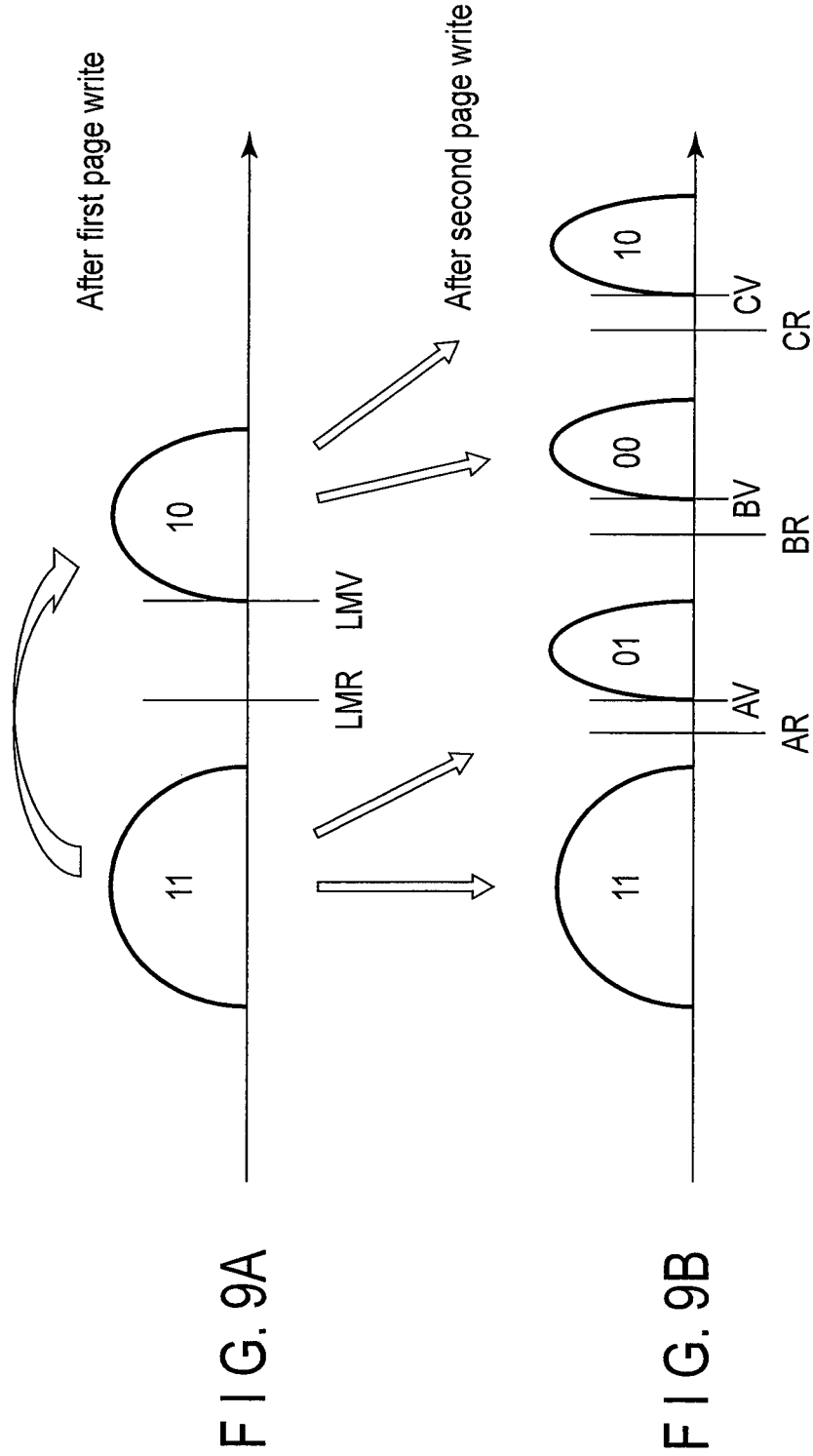
F I G. 9A
F I G. 9B

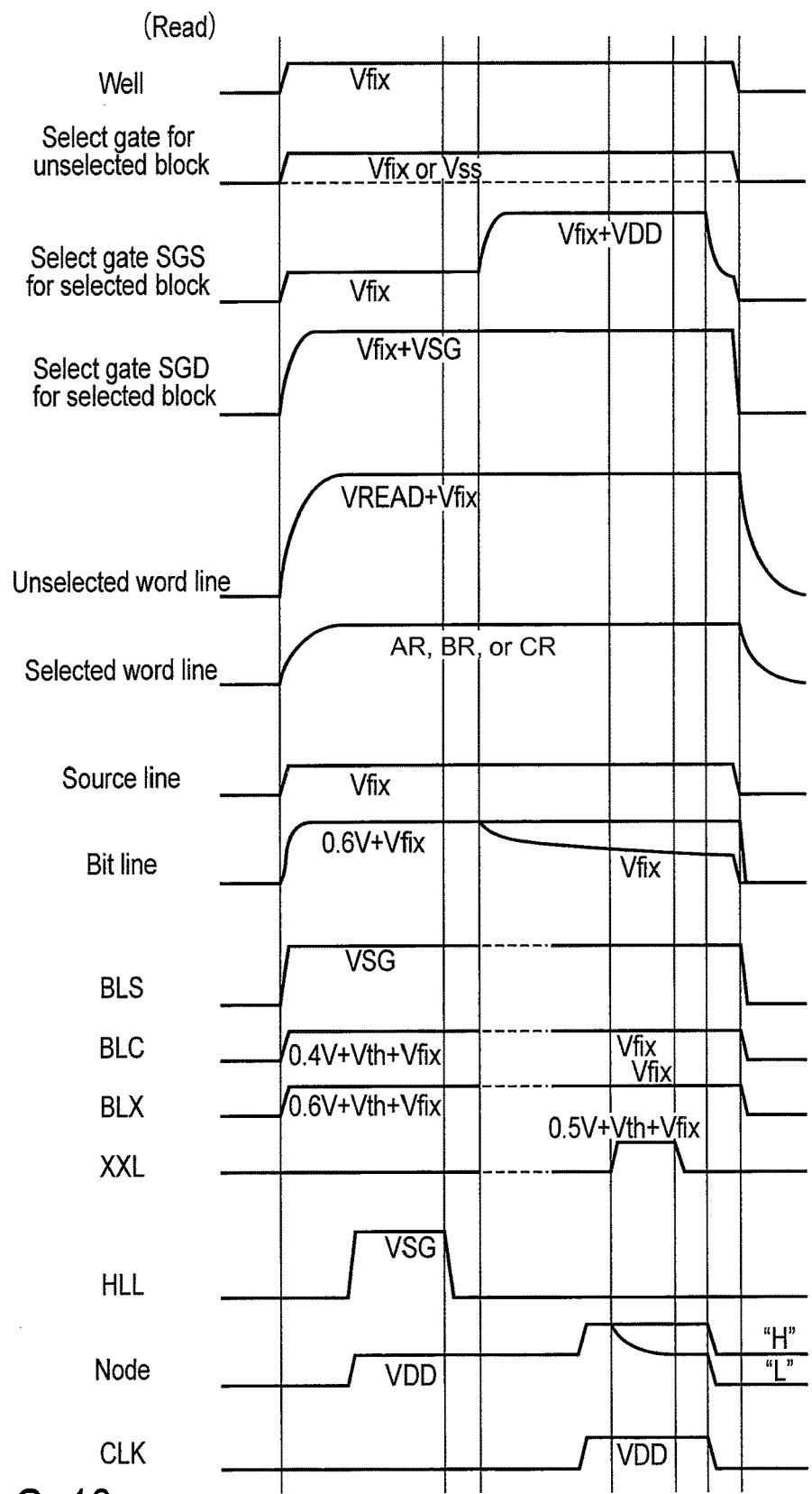
F I G. 10

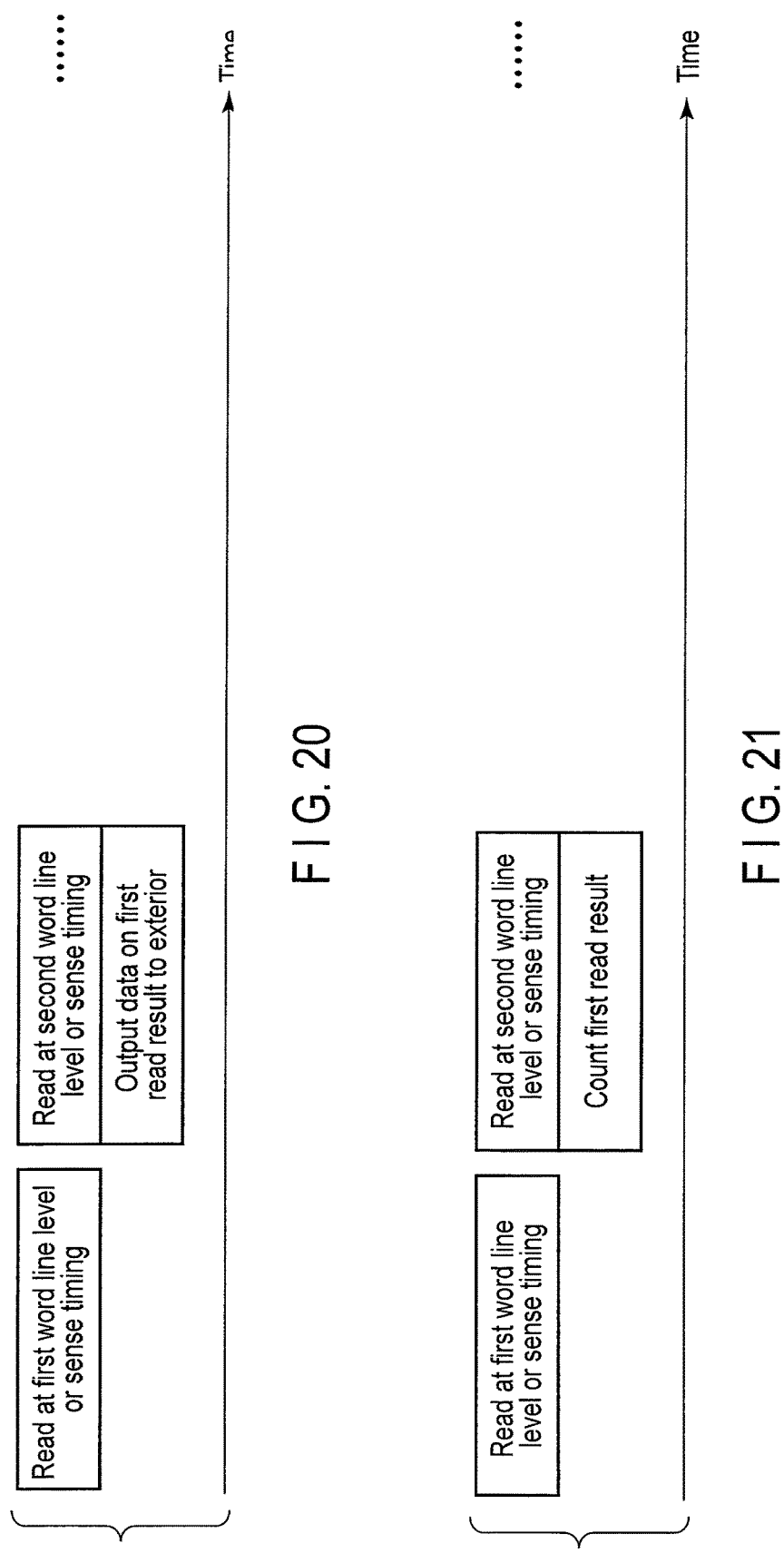

TWO-LEVEL AND MULTI-LEVEL DATA STORAGE SEMICONDUCTOR MEMORY DEVICE

CROSS-REFERENCE TO RELATED APPLICATIONS

This application is a Continuation application of U.S. Ser. No. 14/023,187 (now U.S. Pat. No. 9,190,161), filed Sep. 10, 2013, which is based upon and claims the benefit of priority from Japanese Patent Application No. 2013-029342, filed Feb. 18, 2013, the entire contents of both of which are incorporated herein by reference.

FIELD

Embodiments described herein relate generally to a semiconductor memory device that can store two-level data and multi-level data, for example, a NAND flash memory.

BACKGROUND

NAND flash memories tend to have their threshold voltage distributions broadened and their data retention properties degraded as memory elements are miniaturized. Thus, error checking and correction (ECC) such as a low-density parity check (LDPC) may be used which has a powerful correcting capability. However, ECC such as LDPC requires information referred to as soft values and which is different from values read at a normal read level. Thus, a read operation (soft bit read) is performed at a level different from the normal read level, and the results are used as soft values used for ECC such as LDPC. However, this disadvantageously extends read time.

BRIEF DESCRIPTION OF THE DRAWINGS

FIG. 5 is a cross-sectional view showing an example of a NAND flash memory;

FIG. 9A and FIG. 9B are diagrams showing an example of a threshold voltage, a verify level, and a read level for two-bit, four-level data;

FIG. 10 is a waveform diagram showing examples of signals at sections during a read;

FIG. 20 is a diagram showing a modification of the second embodiment; and

FIG. 21 is a diagram showing another modification of the second embodiment.

BRIEF SUMMARY OF THE INVENTION

In general, according to one embodiment, a semiconductor includes a memory cell, a bit line, a word line, a sense amplifier, and a control circuit. The memory cell stores n levels (where n is a natural number of two or greater). The bit line is connected to the memory cell. The word line is connected to the memory cell. The sense amplifier is connected to the bit line to detect a voltage of the bit line. The control circuit controls potentials of the word line and the bit line. In a read of k−1 levels (k≤n) stored in the memory cell, the control circuit, upon applying a given voltage to the word line, determines read data based on first data corresponding to the voltage of the bit line read at a first timing by the sense amplifier and second data corresponding to the voltage of the bit line read, by the sense amplifier, at a second timing different from the first timing.

According to the present embodiment, in a soft bit read using not only normal read levels but also different levels, data is read by a read operation with a sense timing different from a sense timing for a normal read, thus reducing the time required for the soft bit read.

Furthermore, because of the level of data retention in memory cells, a scheme has recently been proposed in which an optimum read level is determined for the data read. However, this read scheme must perform a plurality of read operations in order to set the optimum read level, requiring much time. Thus, the present embodiment performs a read operation with a sense timing different from the sense timing for the normal read changed, reducing the read time.

Additionally, during data output, the present embodiment reduces the number of bits in output data for the main part of a threshold voltage distribution, while increasing the number of bits in output data for a skirt of the threshold voltage distribution which contains a small number of data, thus reducing the total amount of output data.

The embodiment will be described below with reference to the drawings. The same components are denoted by the same reference numbers throughout the drawings.

DETAILED DESCRIPTION (Embodiment)

Figure 1:
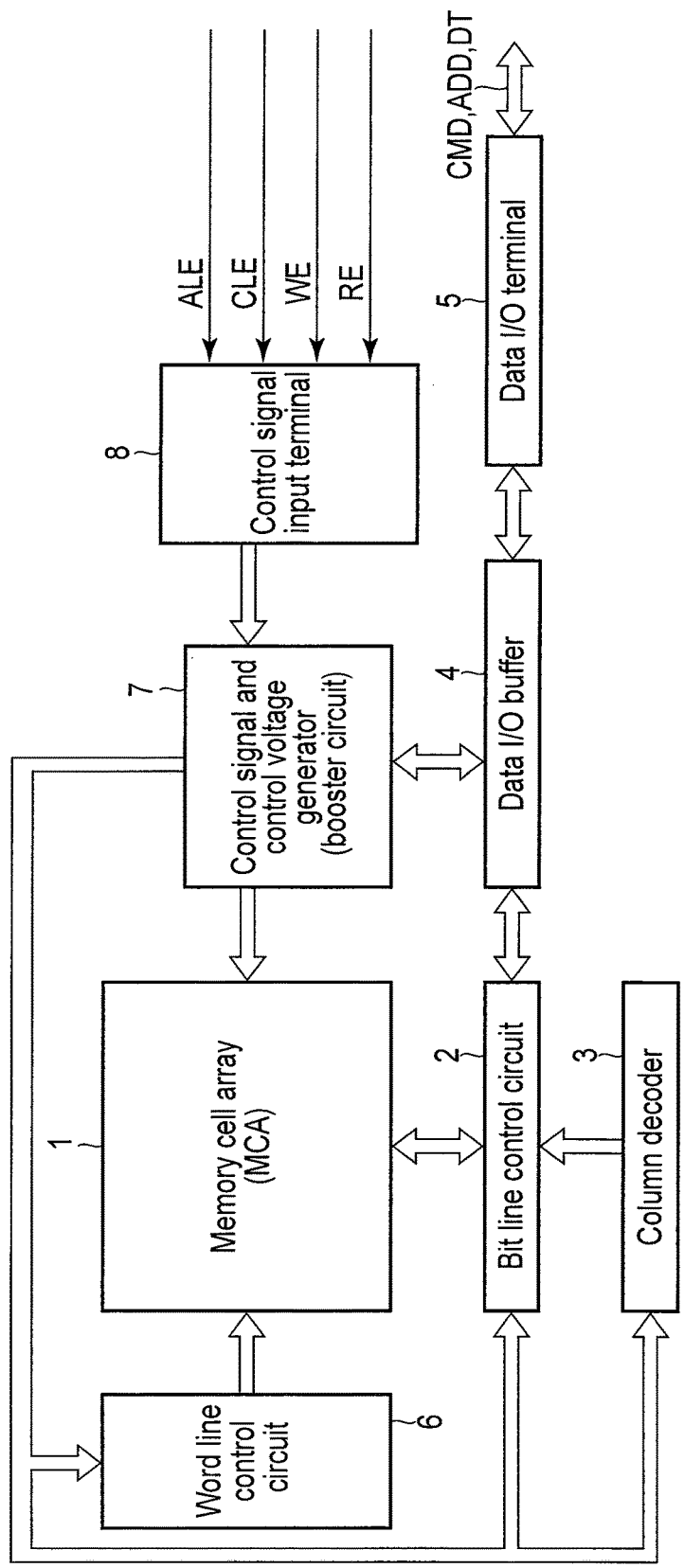
FIG. 1 is a diagram showing a semiconductor memory device applied to the present embodiment.

FIG. 1 shows a NAND flash memory serving as a semiconductor memory device that stores two levels (one bit) or four levels (two bits) in memory cells.

A memory cell array 1 includes a plurality of bit lines, a plurality of word lines, a common source line, and memory cells arranged in a matrix and each of which comprises, for example, an EEPROM cell and allows data to be electrically rewritten. The memory cell array 1 connects to a bit control circuit 2 configured to control bit lines and a word line control circuit 6.

The bit line control circuit 2 reads a memory cell in the memory cell array 1 via the corresponding bit line, detects the state of a memory cell in the memory cell array 1 via the corresponding bit line, and applies a write control voltage to a memory cell in the memory cell array 1 via the corresponding bit line to write data to the memory cell. The bit line control circuit 2 connects to a column decoder 3 and a data input/out (I/O) buffer 4. The column decoder 3 selects from data storage circuits in the bit line control circuit 2. Data from the memory cell read into the data storage circuit is externally output from a data I/O terminal 5 via the data I/O buffer 4. The data I/O terminal 5 is connected to a host (not shown in the drawings) external to a memory chip. The host comprises, for example, a microcomputer and receives the data output from the data I/O terminal 5. Moreover, the host (not shown) various commands CMD that control the operation of the NAND flash memory, addresses ADD, and data DT. The write data input to the data I/O terminal 5 by the host is fed via the data I/O buffer 4, to the data storage circuit selected by the column decoder 3. The commands and addresses are fed to a control signal and control voltage generator 7.

The word line control circuit 6 is connected to the memory cell array 1. The word line control circuit 6 selects from the word lines in the memory cell array 1, and applies a voltage required for a read, write, or erase to the selected word line.

The memory cell array 1, the bit line control circuit 2, the column decoder 3, the data I/O buffer 4, and the word line control circuit 6 are connected to the control signal and control voltage generator 7, which controls the memory cell array 1, the bit line control circuit 2, the column decoder 3, the data I/O buffer 4, and the word line control circuit 6. The control signal and control voltage generator 7 is connected to a control signal input terminal 8 and controlled by control signals ALE [Address Latch Enable], CLE [Command Latch Enable], WE [Write Enable], and RE [Read Enable] which are input by the host via the control signal input terminal 8. The control signal and control voltage generator 7 generates voltages for the corresponding word line and bit line during a write, and generates a voltage supplied to a well as described below. The control signal and control voltage generator 7 includes a booster circuit, for example, a charge pump circuit and can generate a program voltage and other high voltages.

The bit line control circuit 2, the column decoder 3, the word line control circuit 6, and the control signal and control voltage generator 7 form a write circuit and a read circuit.

Figure 2:
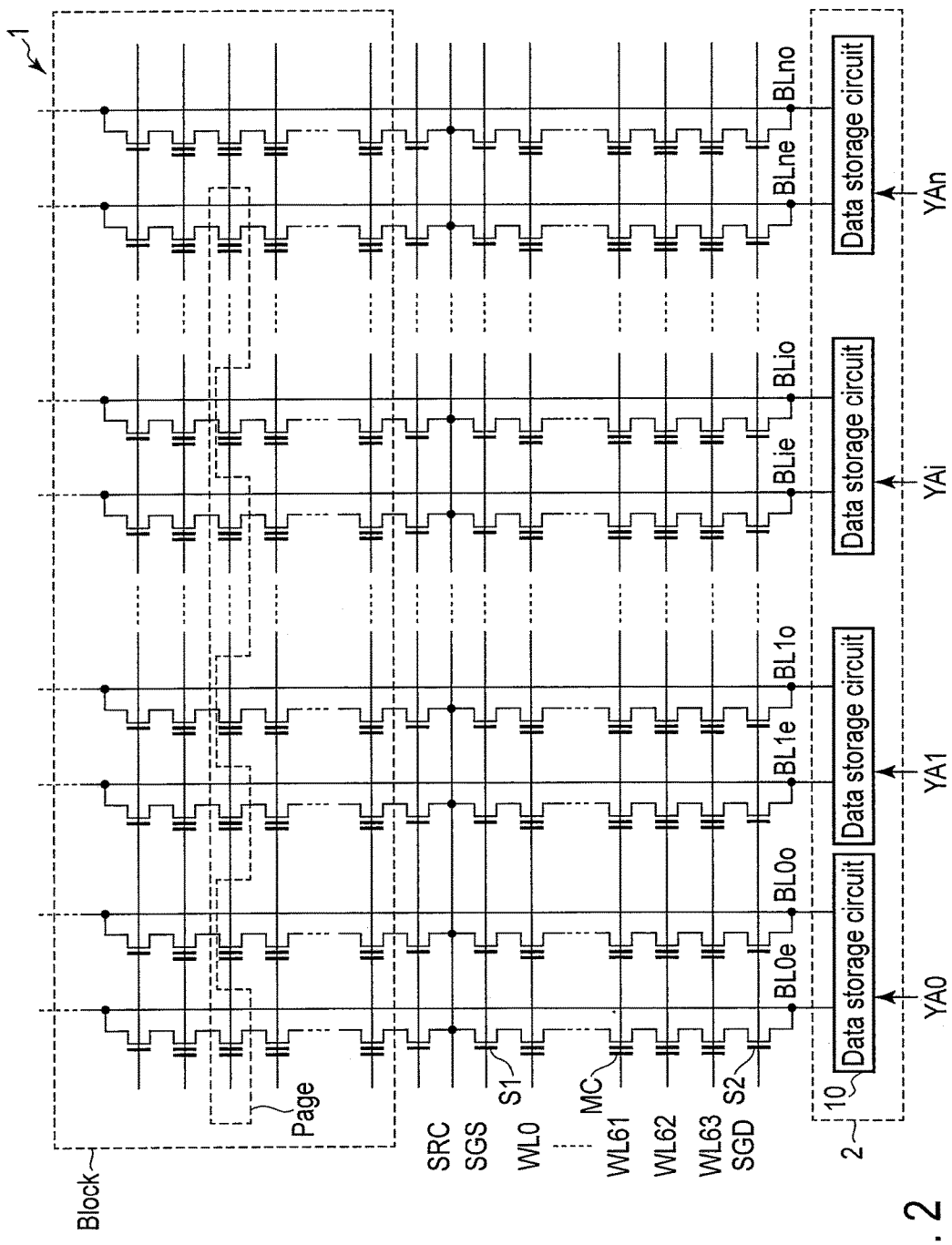
FIG. 2 is a circuit diagram showing an example of a memory cell array and a bit line control circuit shown in FIG. 1.

FIG. 2 shows an example of a configuration of the memory cell array 1 and the bit line control circuit 2 shown in FIG. 1. The memory cell array 1 comprises a plurality of NAND units arranged therein. Each of the NAND units comprises 64 memory cells MC which are, for example, connected together in series and which use, for example, EEPROMs, and select gates S1 and S2 connected in series with the respective opposite ends of the array of the series-connected memory cells MC. The select gate S2 is connected to a bit line BL0e, and the select gate S1 is connected to a source line SRC. Control gates of memory cells MC arranged in each row are all connected to a corresponding one of word lines WL0 to WL63. Furthermore, all the select gates S2 are connected to a select line SGD, and all the select gates S1 are connected to a select line SGS.

The bit line control circuit 2 comprises a plurality of data storage circuits 10. Each of the data storage circuits 10 connects to a pair of bit lines (BL0e, BL0o), (BL1e, BL1o), . . . , (BLie, BLio), or (BLne, BLno).

The memory cell array 1 includes a plurality of blocks as shown by dashed lines. Each of the blocks comprises a plurality of NAND units, and for example, data is erased in units of the blocks. Additionally, an erase operation is performed simultaneously on two bit lines connected to the data storage circuit 10.

Furthermore, a plurality of memory cells MC arranged on every other bit line and connected to one word line (the memory cells within a range enclosed by dashed lines) forms a page. Data is written to and read from each page. That is, half of the plurality of memory cells arranged in a row direction is connected to the corresponding bit lines. Thus, a write operation or a read operation is performed on each half of the plurality of memory cells arranged in the row direction.

During a read operation, a program verify operation, and a program operation, one of the two bit lines (BLie, BLio) connected to the data storage circuit 10 is selected in accordance with an externally supplied address signal (YA0, YA1, . . . , YAi, . . . , YAn). Moreover, in accordance with the external address, one word line is selected, and two pages shown by dashed lines are selected. The two pages are switched based on addresses.

Storing two bits in one cell involves two pages. However, storing one bit in one cell involves one page. Storing three bits in one cell involves three pages. Storing four bits in one cell involves four pages.

Figure 3:
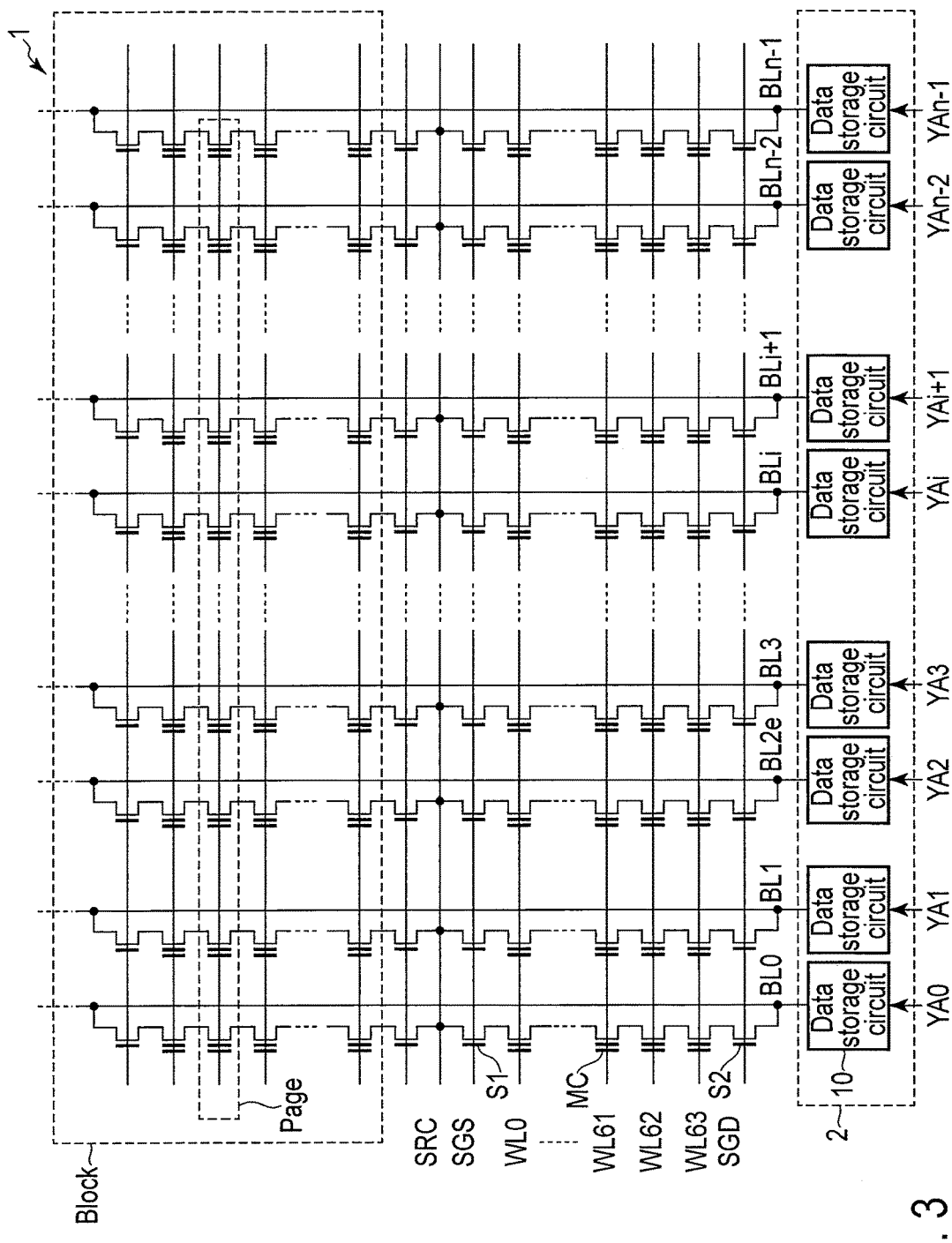
FIG. 3 is a circuit diagram showing another example of the memory cell array and the bit line control circuit shown in FIG. 1.

FIG. 3 shows another example of a configuration of the memory cell array 1 and the bit line control circuit 2 shown in FIG. 1. In the configuration shown in FIG. 2, two bit lines (BLie, BLio) are connected to the data storage circuit 10. In contrast, in a configuration shown in FIG. 3, the data storage circuit 10 is connected to each bit line, and a plurality of memory cells arranged in the row direction is all connected to the corresponding bit lines. Thus, a write operation or a read operation can be performed on all the memory cells arranged in the row direction.

The following description is applicable to both the configuration shown in FIG. 2 and the configuration shown in FIG. 3, but the use of the configuration in FIG. 3 will be described.

Figures 4A, 4B:
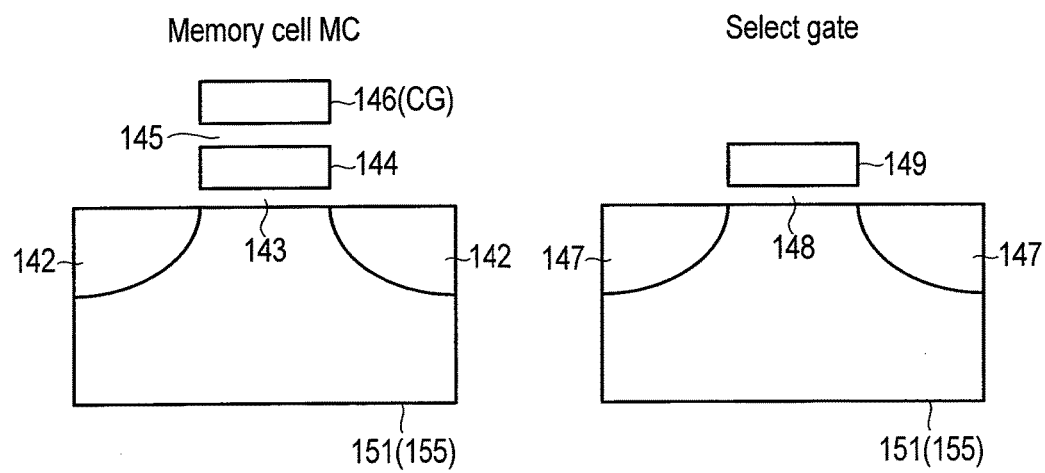
FIG. 4A and FIG. 4B are cross-sectional views showing an example of a memory cell and a select transistor.

FIG. 4A and FIG. 4B are cross-sectional views of the memory cell and the select transistor. FIG. 4A shows the memory cell. An n-type diffusion layer 142 serving as the source and the drain of the memory cell is formed in a substrate 151 (a P-type well region 155 described below). A charge accumulation layer 144 is formed on the P-type well region 155 via a gate insulating film 143. A control gate (CG) 146 is formed on the charge accumulation layer 144 via an insulating film 145. FIG. 4B shows the select gate. An n-type diffusion layer 147 serving as the source and the drain is formed in the P-type well region 155. A control gate 149 is formed on the P-type well region 155 via a gate insulating film 148.

FIG. 5 shows a cross-sectional view of the NAND flash memory. For example, the P-type semiconductor substrate 151 comprises N-type well regions 152, 153, and 154 and a P-type well region 156 formed therein. P+diffusion layers (P+) and N+diffusion layers (N+) are formed in the P-type semiconductor substrate 151, the N-type well regions 152, 153 and 154, and the P-type well regions 155 and 156. The P-type well region 155 is formed in the N-type well region 152, and a low-voltage N-channel transistor LVNTr included in the memory cell array 1 is formed in the P-type well region 155. Moreover, a low-voltage P-channel transistor LVPTr and a low-voltage N-channel transistor LVNTr forming the data storage circuit 10 are formed in the N-type well region 153 and the P-type well region 156, respectively. A high-voltage N-channel transistor HVNTr connecting the bit line and the data storage circuit 10 together is formed in the substrate 151. Furthermore, a high-voltage P-channel transistor HVPTr included in, for example, the word line control circuit is formed in the N-type well region 154. As shown in FIG. 5, the high-voltage transistors HVNTr and HVPTr have, for example, thicker gate insulating films than the low-voltage transistors LVNTr and LVPTr.

Figures 6, 7:
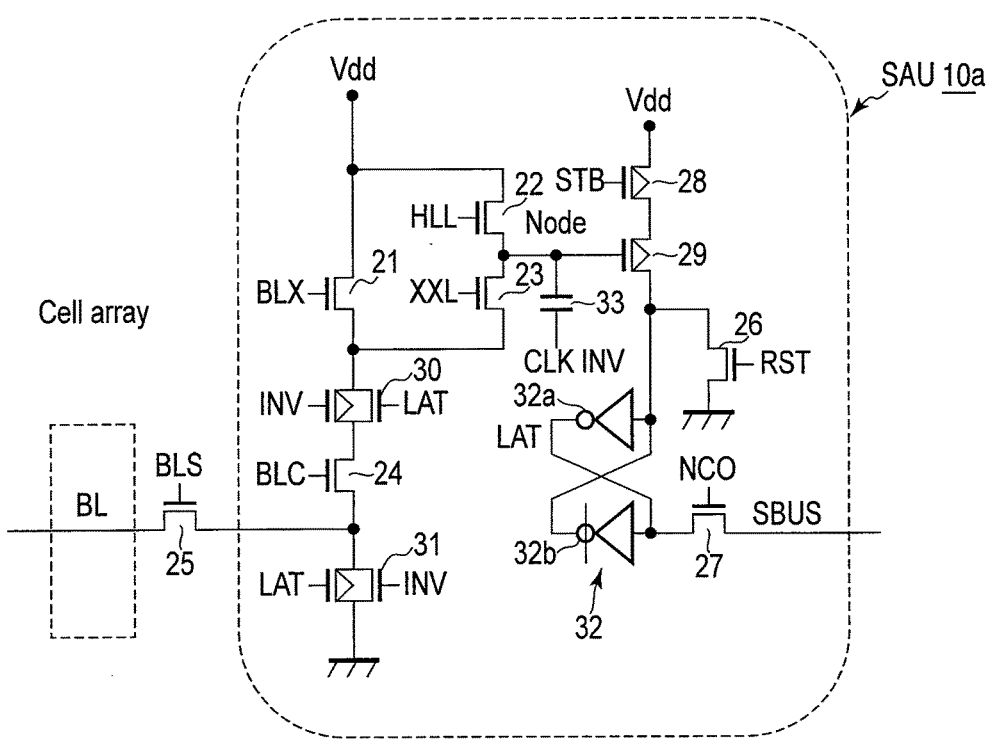
FIG. 6 is a diagram showing an example of voltages supplied to regions shown in FIG. 5.
FIG. 7 is a circuit diagram showing an example of a part of a data storage circuit shown in FIG. 3.

FIG. 6 shows an example of voltages supplied to regions shown in FIG. 5. For an erase, program, and read, such voltages as shown in FIG. 6 are supplied to the regions. A voltage applied to the substrate during an erase is denoted by Vera(20V), ground voltage is denoted by Vss(0V), and a power supply voltage is denoted by Vdd(2.5V). A voltage applied to the gate of an N-channel MOS transistor in a row decoder during a write is denoted by Vpgmh, and is a potential that allows a write voltage Vpgm for the word line to pass through the N-channel MOS transistor without reducing the write voltage Vpgm by an amount equivalent to a threshold voltage for the N-channel MOS transistor. That is, Vpgmh is equal to the voltage supplied to the word line Vpgm +Vth (where Vth is the threshold voltage of the N-channel MOS transistor). A voltage applied to the gate of an N-channel MOS transistor in the row decoder during a read is denoted by Vreadh, and is a potential that allows Vread to pass through the N-channel MOS transistor without reducing Vread by an amount equivalent to a threshold voltage for the N-channel MOS transistor. That is, Vreadh is supplied to the word line and is equal to Vread +Vth (where Vth is the threshold voltage of the N-channel MOS transistor).

In addition, a voltage supplied to a word line for an unselected cell during a write is denoted by Vpass, and a voltage applied to an unselected word line during a read is denoted by Vread.

Figure 8:
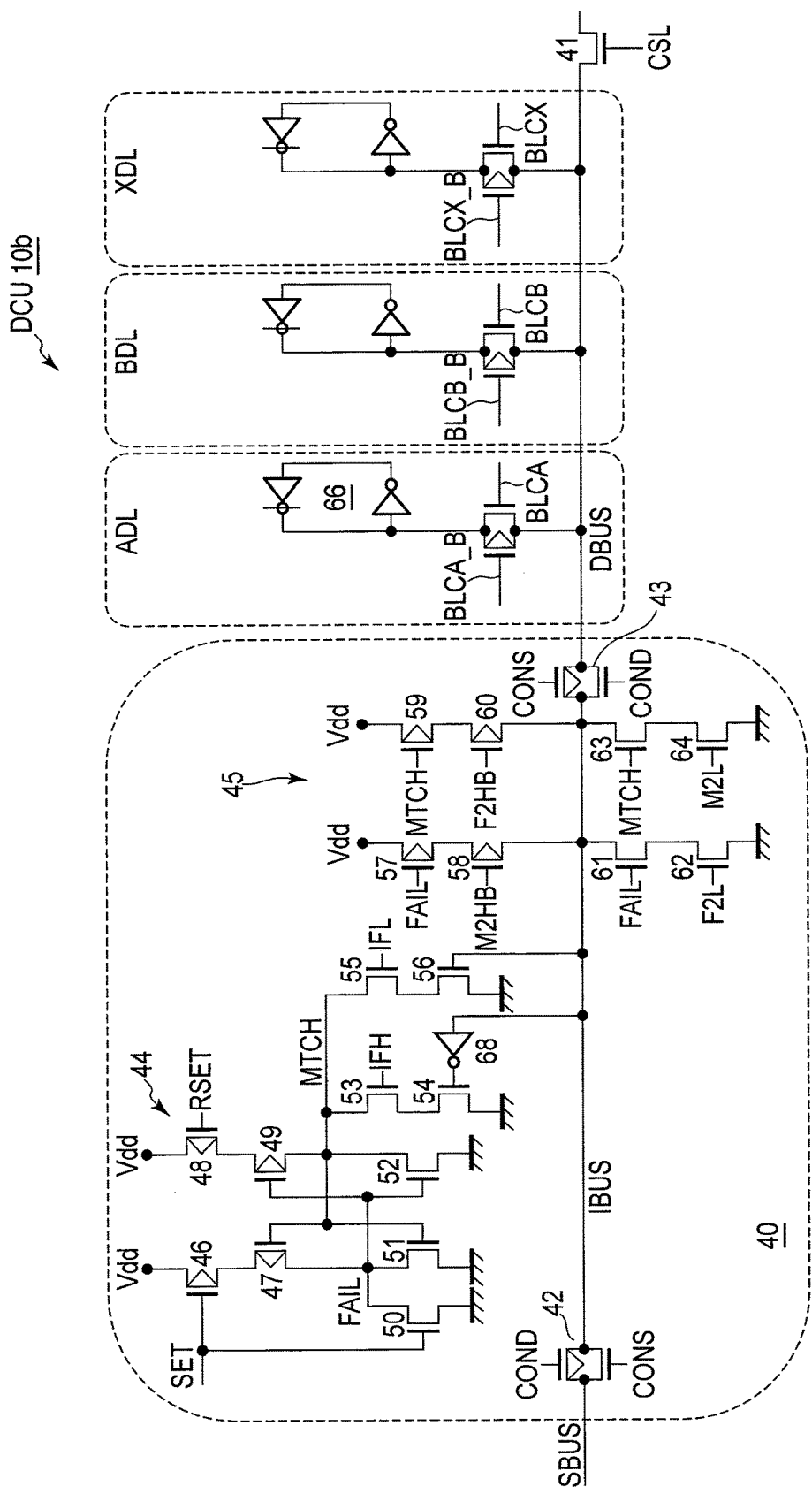
FIG. 8 is a circuit diagram showing an example of another part of the data storage circuit shown in FIG. 3.

FIG. 7 and FIG. 8 show an example of the data storage circuit 10 shown in FIG. 3. The data storage circuit 10 comprises a sense amplifier unit (SAU) 10a and a data control unit (DCU) 10b shown in FIG. 8.

As shown in FIG. 7, the sense amplifier 10a comprises a plurality of N-channel MOS transistors (hereinafter referred to as NMOSs) 21 to 27, a plurality of P-channel MOS transistors (hereinafter referred to as PMOSs) 28 and 29, transfer gates 30 and 31, a latch circuit 32, and a capacitor 33. The latch circuit 32 comprises, for example, clocked inverter circuits 32a and 32b.

One end of a current path in NMOS 21 is connected to a node to which the power supply Vdd is supplied. The other end of the current path is grounded via transfer gate 30, NMOS 24, and transfer gate 31. A connection node between NMOS 24 and transfer gate 31 connects to one end of a current path in NMOS 25. The other end of NMOS 25 is connected to the corresponding bit line BL in the memory cell array. NMOS 21 connects in parallel with a series circuit of NMOSs 22 and 23.

Furthermore, one end of a current path in PMOS 28 is connected to a node to which the power supply Vdd is supplied. The other end of the current path is connected via PMOS 29 to an input end of inverter circuit 32a included in the latch circuit 32 and is grounded via NMOS 26. An input end of clocked inverter circuit 32b cross-connected to inverter circuit 32a is connected to the data control unit (DCU) 10b via NMOS 27. Furthermore, the gate of PMOS 29 is connected to a connection node between NMOSs 22 and 23. The connection node connects to one end of the capacitor 33. The other end of the capacitor 33 is supplied with a clock signal CLK INV.

The gate of NMOS 21 is supplied with a signal BLX. The gate of the NMOS included in transfer gate 30 is supplied with a signal LAT at an output end of inverter circuit 32a included in the latch circuit 32. The gate of the PMOS transistor is supplied with a signal INV at an input end of inverter circuit 32a. The gate of NMOS 24 is supplied with a signal BLC, and the gate of NMOS 25 is supplied with a signal BLS.

The gate of NMOS 22 is supplied with a signal HLL, and the gate of NMOS 23 is supplied with a signal XXL.

The gate of PMOS 28 is supplied with a signal STB, and the gate of NMOS 26 is supplied with a reset signal RST. The gate of NMOS 27 is supplied with a signal NCO.

The operation of the sense amplifier unit will be described in brief.
(Write Operation)

When data is written to a memory cell, first, signal STB is made high, and the reset signal RST is momentarily made high to reset the latch circuit 32. LAT is made high, and signal INV is made low.

Subsequently, signal NCO is made high to retrieve data from the data control unit 10b. If the data is low (binary 0), which is indicative of a write, signal LAT is made low and signal INV is made high. Furthermore, if the data is high (binary 1), which is indicative of a non-write, the data in the latch circuit 32 is unchanged, signal LAT is kept high, and signal INV is kept low.

Then, when signals BLX, BLC, and BLS are made high, if signal LAT at the latch circuit 32 is low and signal INV at the latch circuit is high (write), transfer gate 30 is off, and transfer gate 31 is on to set the bit line BL to Vss. In this state, when the word line is set to the program voltage Vpgm, data is written to the memory cell.

On the other hand, in the latch circuit 32, if signal LAT is high and signal INV is low (non-write), transfer gate 30 is on and transfer gate 31 is off, and thus, the bit line BL is charged to Vdd. Thus, if the word line changes to Vpgm, a channel of the cell is boosted to a higher potential, preventing data from being written to the memory cell.
(Read Operation and Program Verify Read Operation)

When a memory cell is read, first, the set signal RST is momentarily made high to reset the latch circuit 32, signal LAT is made high, and signal INV is made low. Subsequently, signals BLS, BLC, BLX, HLL, and XXL are set to predetermined voltages (VSG, 0.4V+Vth+Vfix, 0.6V+Vth+Vfix, VSG, 0.5V+Vth+Vfix) to charge the bit line BL. In addition, the node of the capacitor 33 is charged to Vdd. If a threshold voltage for the memory cell is higher than the read level, the memory cell is off, and the bit line is kept high. That is, the node is kept high. Furthermore, if the threshold voltage for the memory cell is lower than the read level, the memory cell is on, and the bit line is discharged. Consequently, the bit line BL is made low. Thus, the node is made low.

Then, when signal STB is made low, if the memory cell is on, the node is low, and thus, PMOS 29 is on to make signal INV at the latch circuit 32 high, while making signal LAT at the latch circuit 32 low. On the other hand, if the memory cell is off, signal INV at the latch circuit 32 is kept low, and signal LAT at the latch circuit 32 is kept high.

Subsequently, when signal NCO is made high, NMOS 27 is on to transfer the data in the latch circuit 32 to the data control unit 10b.

A program verify operation of verifying the threshold voltage of the memory cell after the write operation is approximately similar to the above-described read operation.

FIG. 8 shows an example of the data control unit (DCU) 10b.

The data control unit 10b shown in FIG. 8 comprises an arithmetic circuit 40 and a plurality of data latch circuits ADL, BDL, XDL, and NMOS 41.

The arithmetic circuit 40 comprises a bus (hereinafter referred to as the IBUS), transfer gates 42 and 43 connected to respective opposite ends of the IBUS and operating complementarily, a latch circuit 44 configured to latch data from the IBUS, and a setting circuit 45 configured to set levels for data latch circuits ADL, BDL, and XDL.

Transfer gate 42 operates in accordance with complementary signals COND and CONS to connect a bus for the sense amplifier unit SAU 10a (hereinafter referred to as the SBUS) and the IBUS together.

Transfer gate 43 operates in accordance with complementary signals CONS and COND to connect the IBUS to a bus to which data latch circuits ADL, BDL, and XDL are connected (hereinafter referred to as the DBUS). While transfer gate 42 is on, transfer gate 43 is off. While transfer gate 42 is off, transfer gate 43 is on.

The latch circuit 44 comprises a plurality of PMOSs 46 to 49, a plurality of NMOSs 50 to 56, and an inerter circuit 68. The gate of PMOS 46 and the gate of NMOS 50 are supplied with a set signal SET. The gate of PMOS 48 is supplied with a reset signal RSET. The gate of NMOS 53 is supplied with a signal IFH. The gate of NMOS 55 is supplied with a signal IFL. The gate of NMOS 54 is connected to the IBUS via the inverter circuit 68. The gate of NMOS 56 is connected to the IBUS.

The setting circuit 45 comprises PMOSs 57 to 60 and NMOSs 61 to 64. The gate of PMOS 57 and the gate of NMOS 61 are supplied with a signal FAIL. Signal FAIL is a signal at a connection node between PMOS 47 and NMOS 51 serving as one output end of the latch circuit 44. The gate of PMOS 59 and the gate of NMOS 63 are supplied with a signal MTCH. Signal MTCH is a signal at a connection node between PMOS 49 and NMOS 52 serving as the other output end of the latch circuit 44. Moreover, the gate of PMOS 58 is supplied with a signal M2HB, and the gate of PMOS 60 is supplied with a signal F2HB. The gate of NMOS 62 is supplied with a signal F2L, and the gate of NMOS 64 is supplied with a signal M2L.

Data latch circuits ADL, BDL, and XDL have the same configuration and each comprise a latch circuit 66 and a transfer gate 65 configured to connect the latch circuit 66 to the DBUS. Each transfer gate 65 is controlled by signals BLCA, BLCB, BLCX, BLCA_B, BLCB_B, and BLCX_B. Data latch circuit XDL is connected to an external I/O via NMOS 41. The gate of NMOS 41 is supplied with a signal CSL.

The data control unit 10b holds write data, and during a read, holds read data.

Two-bit write data supplied by a data I/O buffer 6 is latched by, for example, data latch circuits ADL and BDL via data latch circuit XDL so that each of data latch circuits ADL and BDL latches one of the two bits.

The arithmetic circuit 40 shown in FIG. 8 can perform arithmetic operations such as an AND operation, an OR operation, and an exclusive NOR operation on data in data latch circuits ADL and BDL. For an AND operation, the data held in data latch circuits ADL and BDL are output to the DBUS and the IBUS. In this case, the IBUS is made high only if both the data held in data latch circuits ADL and BDL are 1, and is otherwise made low. That is, the IBUS is at 1 only during a non-write and is at 0 during a write. A write is performed by transferring the data held in data latch circuits ADL and BDL to the sense amplifier unit 10a shown in FIG. 7.

The arithmetic circuit 40 shown in FIG. 8 may be provided such that one arithmetic circuit 40 is disposed for a plurality of the sense amplifier units (SAU) 10a shown in FIG. 7 and a plurality of data control units (DCU) 10b shown in FIG. 8. This enables a reduction in circuit area.

The operation of the arithmetic circuit 40 may be varied. For example, various control methods are applicable to one logical operation, and the control method may be changed as necessary.

The NAND flash memory according to the present embodiment is a multilevel memory and can thus store two-bit data in one cell. The two bits are switched based on the addresses (first page and second page). Storing two bits in one cell involves two pages, but if three bits are stored in one cell, each bit is switched based on the addresses (first page, second page, and third page). Moreover, if four bits are stored in one cell, each bit is switched based on the addresses (first page, second page, third page, and fourth page).

According to the present embodiment, one-bit data can be stored in one cell, but if two-bit data is stored in one memory cell, the two-bit data is switched based on the addresses (first page and second page). Furthermore, if three-bit data is stored in one memory cell, the three-bit data is switched based on the addresses (first page, second page, and third page). Moreover, if four-bit data is stored in one memory cell, the four-bit data is switched based on the addresses (first page, second page, third page, and fourth page).

In the case described below, for example, data is written and read, at a time, to and from the memory cells arranged in the row direction as shown in FIG. 3, and two-bit, four-level data is stored in one cell.

(Threshold Voltage Distribution)

FIG. 9A and FIG. 9B show the state of data in a memory cell, the threshold voltage, a verify level, and the read level after two-bit, four-level data is written to the first page and the second page.

As shown in FIG. 9A, an erase operation sets the threshold voltage for the data in the memory cell to 11. When data is written to the first page, the memory cell remains in an erased state or the write is performed at level LMV and the threshold voltage for the data in the memory cell is set to 11 or 10.

As shown in FIG. 9B, when data is written to the second page, the memory cell remains in the erased state or the write is performed at one of levels AV, BV, and CV and the threshold voltage for the data in the memory cell is set to 11, 01, 00, or 10. The verify level is set slightly higher for a write than for a read in order to provide a data retention margin. In FIG. 9A and FIG. 9B, the read level is denoted by LMR, AR, BR, and CR, and the verify read level is denoted by LMV, AV, BV, and CV.

(Program Operation)

A write is sequentially performed starting with memory cells closest to the source line. That is, a write is sequentially performed starting with the memory cells connected to word line WL0 and ending with the memory cell connected to word line WL63, as shown in FIG. 3.

First, the data for the first page to be written to word line WL0 is temporarily stored in data latch circuit XDL in the data storage circuit 10 shown in FIG. 8.

Subsequently, the data stored in data latch circuit XDL is written to the first page of each of the memory cells on word line WL0.

Then, the data for the first page to be written to word line WL1 is temporarily stored in data latch circuit XDL in the data storage circuit 10 shown in FIG. 8.

Subsequently, the data stored in data latch circuit XDL is written to the first page of the memory cells on word line WL1.

Moreover, the data for the second page to be written to word line WL0 is temporarily stored in data latch circuit XDL in the data storage circuit 10 shown in FIG. 8.

Subsequently, the data stored in data latch circuit XDL is written to the second page of the memory cells on word line WL0.

When the data for the first and second pages is thus written, such a threshold voltage distribution as shown in FIG. 9A and FIG. 9B is obtained.

Subsequently, a write is performed on the first page on word line WL2 and then on the second page on word line WL1.

(Read Operation)

On the other hand, when data is read from a memory cell to which data has been written as described above, soft bit read is performed. According to the present embodiment, the soft bit read involves reading data with a sense timing different from the sense timing for the normal read.

FIG. 10 shows signal waveforms at the sections of the memory cell array 1 and the data storage circuit 10 during a read.

During a read, the corresponding bit line is supplied with a predetermined voltage (for example, 0.6 V+Vfix; a fixed voltage is denoted by Vfix), and a selected word line is supplied with read level voltages AR, BR, and CR shown in FIG. 9B. If the threshold voltage of the memory cell is lower than the voltage of the word line, the memory cell is on and the voltage of the bit line is made low. If the threshold voltage of the memory cell is higher than the voltage of the word line, the memory cell is off and the voltage of the bit line is made high.

Now, the node in the sense amplifier unit 10a shown in FIG. 7 is precharged to make CLK high, while setting signal XXL to, for example, 0.45 V+Vth+Vfix. Then, when the potential of the bit line is low, the node in the sense amplifier unit 10a is made low. When the potential of the bit line is high, the node in the sense amplifier unit 10a is made high. Subsequently, the clock signal CLK is made low, and the voltage of the bit line is read.

(Normal Read Operation)

Figure 11:
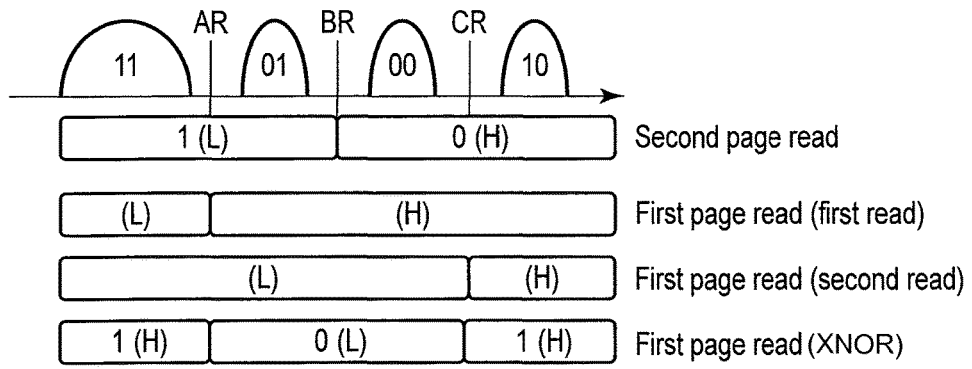
FIG. 11 is a diagram showing relationships between a normal read operation and read data.

FIG. 11 shows relationships between the normal read operation and read data. (H) and (L) are indicative of the level status of the bitline BL, the node of the sense amplifier unit 10a, and the data latch circuit. Specifically, (H) indicates that the level of the bitline BL reaches high when the memory cell is off, and (L) indicates that the level of the bitline BL reaches low when the memory cell is on. If the bitline BL is in (L) state in the first read, (H) comes next. A combination of "0"s and "1"s are ultimately output as 2-bit data. In a read from the second page, the potential of the word line is set to BR. If the threshold of a memory cell is lower than BR, data latch circuit XDL is made low to output binary 1. On the other hand, if the threshold of the memory cell is higher than BR, data latch circuit XDL is made high to output binary 0.

Then, during the first read from the first page, first, the potential of the word line is set to AR. If the threshold voltage of the memory cell is lower than AR, the node in the sense amplifier unit 10a is made low. On the other hand, if the threshold voltage of the memory cell is higher than AR, the node in the sense amplifier unit 10a is made high. The result is held in one of data latch circuits ADL, BDL, and XDL, for example, ADL.

Subsequently, during the second read from the first page, the potential of the word line is set to CR. If the threshold voltage of the memory cell is lower than CR, the node in the sense amplifier unit 10a is made low. On the other hand, if the threshold voltage of the memory cell is higher than CR, the node in the sense amplifier unit 10a is made high. The result is held in data latch circuit BDL.

The arithmetic circuit 40 performs a logical operation, for example, an XNOR operation on the result of the second read held in data latch circuit BDL and the result of the first read held in data latch circuit ADL. As a result of the operation, if the threshold voltage of the memory cell is lower than AR or higher than CR, output is binary 1. If the threshold voltage of the memory cell is higher than AR and lower than CR, output is binary 0.

(Read Operation During Soft Bit Read)

Figure 12:
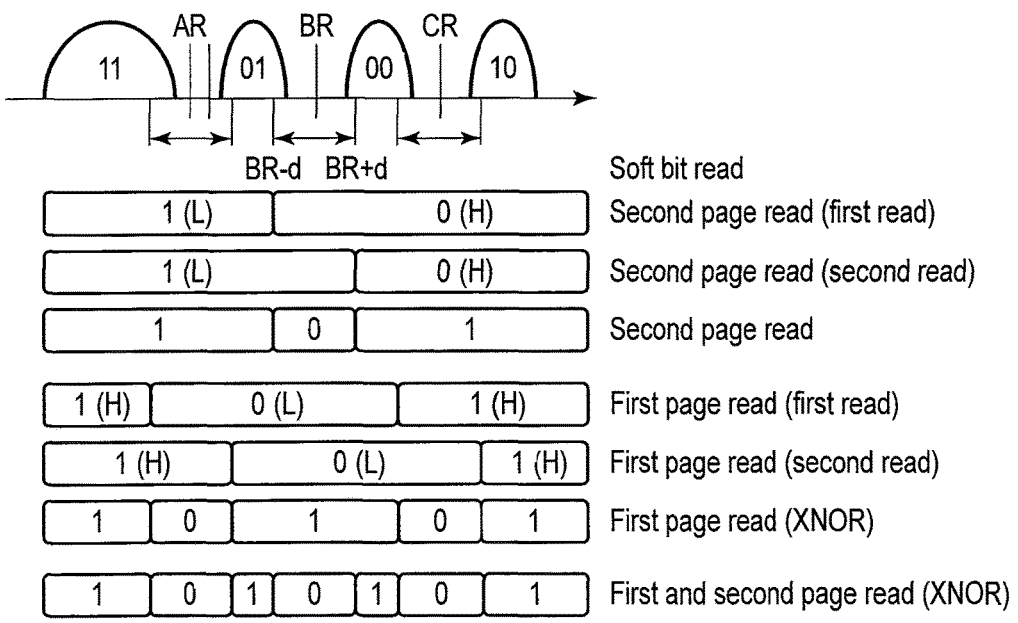
FIG. 12 is a diagram showing relationships between read data and the read level during a common soft bit read.

ECC such as LDPC requires data referred to as a soft value and which is different from data read at the normal read level. FIG. 12 shows relationships between read data and the read level during a soft bit read. (H) and (L) are indicative of the level status of the bitline BL, the node of the sense amp unit 10a, and the data latch circuit. Specifically, (H) indicates that the level of the bitline BL reaches high when the memory cell is off, and (L) indicates that the level of the bitline BL reaches low when the memory cell is on. If the bitline BL is in (L) state in the first read, (H) comes next. A combination of "0"s and "1"s are ultimately output as 2-bit data.

For the soft bit read, the threshold voltages of memory cells are read at read levels AR-d, BR-d, and CR-d set slightly lower than read levels AR, BR, and CR and read levels AR+d, BR+d, and CR+d set slightly higher than read levels AR, BR, and CR, and the results are subjected to an XNOR operation and then externally output.

Moreover, an XNOR operation may be performed on the results of a soft bit read from the first page and the second page, and the resultant one-bit data may be externally output.

As shown in FIG. 12, the range within which soft bit read data is 0 is not the main part of the threshold voltage distribution. Thus, the data within this range is expected to be unlikely to be incorrect, and ECC is carried out. In the conventional technique, data is read from memory cells by three read operations at AR, BR, and CR, respectively. However, at each of the read levels, a read operation must be performed at a read level set slightly lower than the original read level and at a read level set slightly higher than the original read level. Thus, the conventional technique involves 3×3=9 read operations, requiring much time for the read operations.

(First Embodiment)

Figure 13:
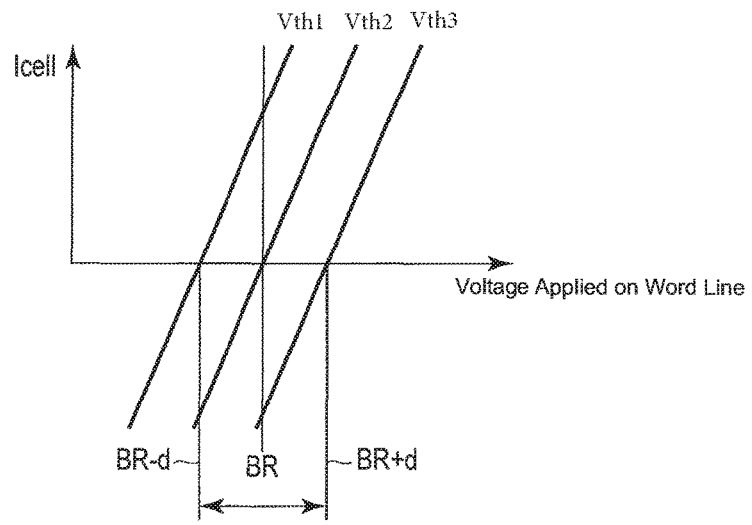
FIG. 13 is a diagram showing relationships between a current flowing through a memory cell and the threshold voltage of the memory cell.
Figure 14:
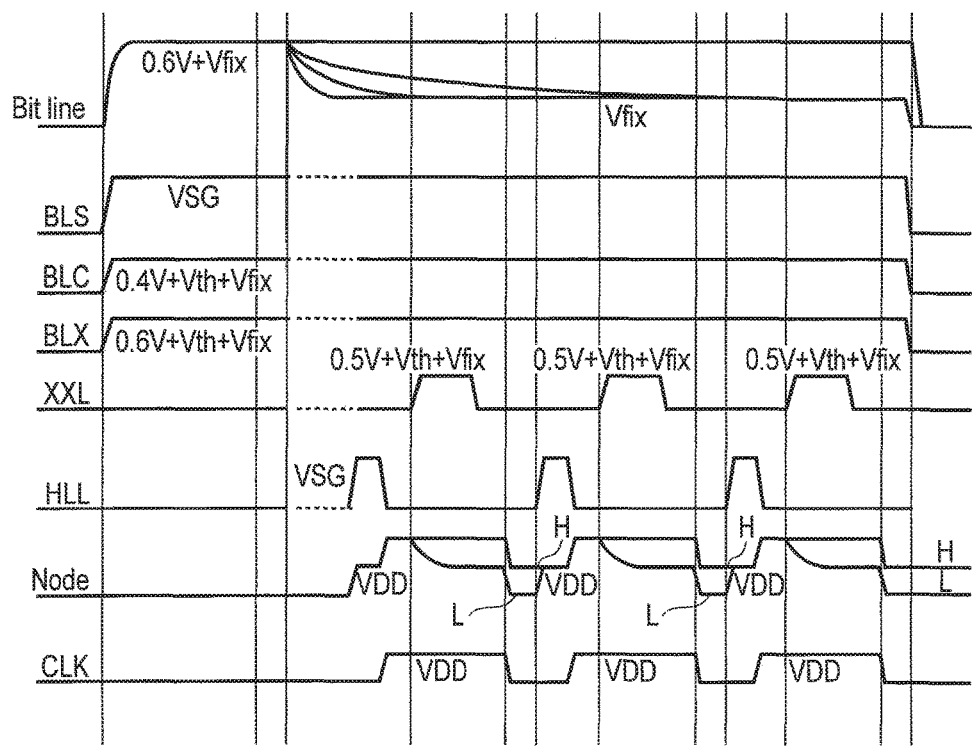
FIG. 14 is a waveform diagram showing examples of signals from sections during a read operation according to a first embodiment.

FIG. 13 shows relationships between a current (Icell) flowing through each of memory cells and the threshold voltage applied on the word line of each of the memory cell (WL) cells. Herein, the memory cells have threshold voltages Vth1 to Vth3 (Vth1<Vth2<Vth3), respectively. When the threshold voltage Vth1 of a memory cell is, for example, equal to read level BR-d, a read with the potential of the word line set to BR results in a higher current flowing through the memory cell. Thus, as shown in FIG. 14, the bit line is discharged quickly, and thus, a sense operation is performed with the time for the discharge of the bit line reduced.

On the other hand, for a memory cell with the threshold voltage Vth3 thereof equal to read level BR+d, a read with the potential of the word line set to BR reduces the current in the memory cell. Thus, as shown in FIG. 14, the bit line is discharged slowly, and thus, a sense operation is performed with the time for the discharge of the bit line increased.

Specifically, during a read, after the discharge of the bit line is started, signal HLL and the clock signal CLK are supplied three times; signal HLL is supplied to the gate electrode of the transistor 22 included in the sense amplifier unit 10a shown in FIG. 7 and the clock signal CLK is supplied to the capacitor 33. In accordance with this operation, the potential of the node is held in the latch circuit 32. That is, if the threshold voltage of the memory cell is much lower than the voltage of the word line, the discharge time for the bit line is short. Thus, when the first clock signal is supplied, the potential of the node is low. Furthermore, if the threshold voltage of the memory cell is slightly lower than the voltage of the word line, the discharge time for the bit line is slightly short. Thus, when the first clock signal is supplied, the potential of the node fails to be made low. Then, when the second clock signal is supplied, the potential of the node is made low. Moreover, if the threshold voltage of the memory cell is slightly lower than the voltage of the word line, the discharge time for the bit line is slightly short. Thus, when the second clock signal is supplied, the potential of the node fails to be made low. Then, when the third clock signal is supplied, the potential of the node is made low. Furthermore, if the threshold voltage of the memory cell is higher than the voltage of the word line, the bit line is kept high. Thus, even when the third clock signal is supplied, the potential of the node is high. The potential of the node is held in the latch circuit 32.

Such a sense operation eliminates the need for three read operations with the level of the word line varied between one read level, a slightly higher read level, and a slightly lower read level. That is, a read operation with the level of the word line unchanged and with the sense timing for the bit line changed exerts reading effects similar to those of a read operation at a plurality of levels.

Figure 15:
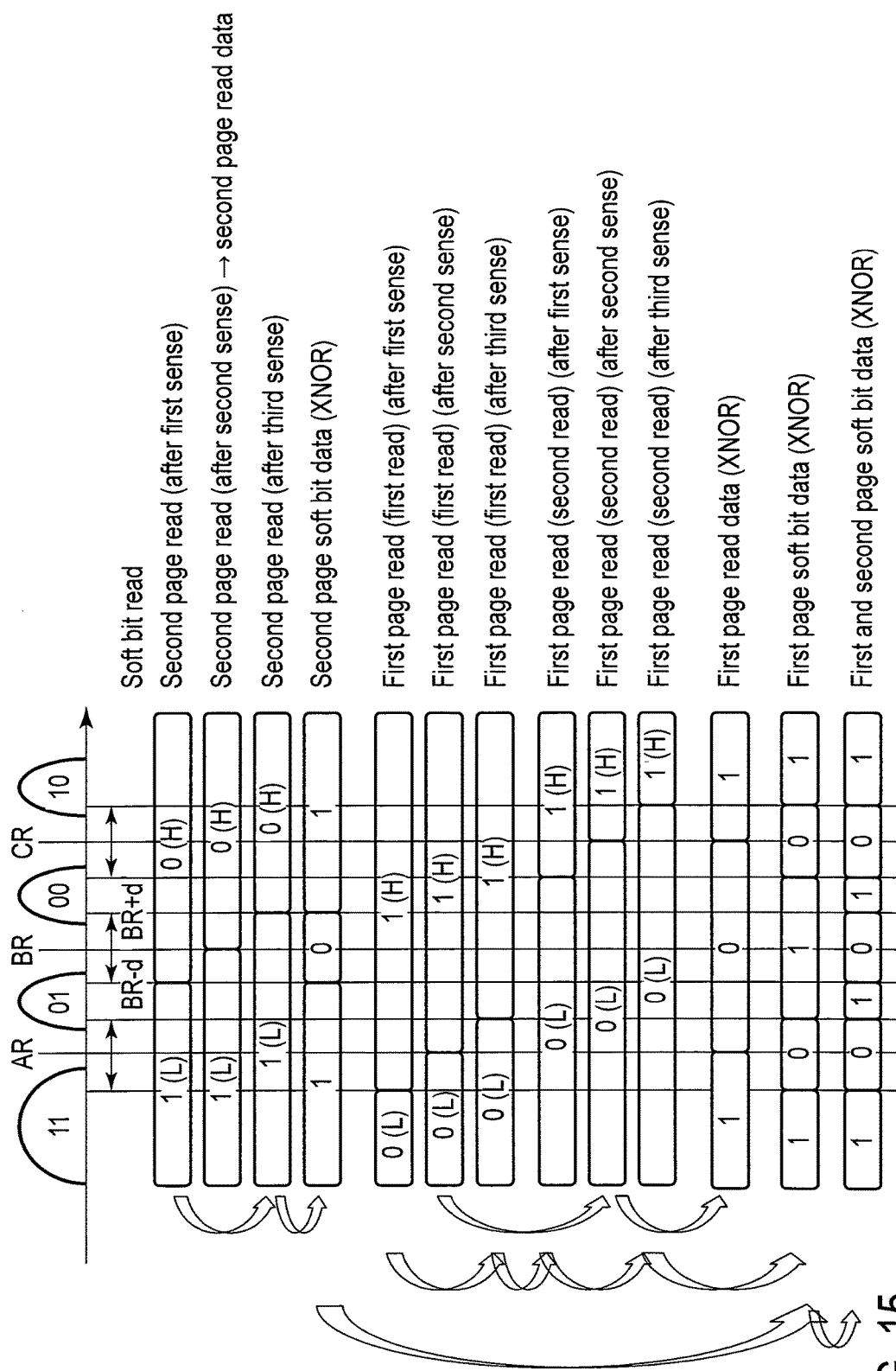
FIG. 15 is a diagram showing an example of data obtained by a soft bit read with different sense timings.

FIG. 15 shows data read by a soft bit read with the sense timing changed. In a read operation performed on one word line, a soft bit read can be achieved by changing the discharge time for the bit line and the timing for the sense operation. (H) and (L) are indicative of the level status of the bitline BL, the node of the sense amp unit 10a, and the data latch circuit. Specifically, (H) indicates that the level of the bitline BL reaches high when the memory cell is off, and (L) indicates that the level of the bitline BL reaches low when the memory cell is on. If the bitline BL is in (L) state in the first read, (H) comes next. A combination of "0"s and "1"s are ultimately output as 2-bit data.

First, a second page read operation is performed. In the second page read operation, data is read three times with the voltage of the selected word line fixed to, for example, BR and with the sense time for the bit line changed. That is, as shown in FIG. 15, the first sense, the second sense, and the third sense for the second page read allow three data to be read. The data resulting from the second sense at BR is the second page read data and may thus be externally output without change. A logical operation, for example, an XNOR operation is performed, by the arithmetic circuit 40, on data resulting from the first sense at BR and data resulting from the third sense at BR. These data are, for example, held in any of latches ADL, BDL, and XDL.

Then, the first read operation on the first page is performed. In the first read operation on the first page, data is read three times with the voltage of the selected word line fixed to, for example, AR and with the sense time for the bit line changed. That is, as shown in FIG. 15, the first sense, the second sense, and the third sense for the first read from the first page allow three data to be read. The data resulting from the second sense at AR is the first page AR read data. A logical operation, for example, an XNOR operation is performed, by the arithmetic circuit 40, on data resulting from the first sense at AR and data resulting from the third sense at AR. Moreover, an XNOR operation may further be performed on the result of the XNOR operation at AR and the above-described result of the XNOR operation at BR. These data are, for example, held in any of latches ADL, BDL, and XDL.

Finally, the second read operation on the first page is performed. In the second read operation on the first page, data is read three times with the voltage of the selected word line fixed to, for example, CR and with the sense time for the bit line changed. That is, as shown in FIG. 15, the first sense, the second sense, and the third sense for the second read from the first page read allow three data to be read. A logical operation, for example, an XNOR operation is performed, by the arithmetic circuit 40, on data resulting from the second sense at CR and data resulting from the second sense at AR. These data are read from the first page and are thus externally output.

A logical operation, for example, an XNOR operation is performed, by the arithmetic circuit 40, on data resulting from the first sense at CR and data resulting from the third sense at CR. Moreover, an XNOR operation may further be performed on the result of the XNOR operation at CR and the above-described results of the XNOR operations at AR and BR. These data are, for example, held in any of latches ADL, BDL, and XDL. The data are subsequently externally output.

An XNOR operation may be performed on the read data to obtain the same read data and soft bit data as the read data and soft bit data in FIG. 13.

The above-described first embodiment enables a soft bit read by, during a read, applying the voltage at the predetermined level to the selected word line and changing the sense timing for the sense amplifier. The first embodiment thus enables a reduction in read time compared to a case where a soft bit read is carried out with the voltage of the word line changed.

The first embodiment uses one word line to carry out a soft bit read with one read data at two levels. However, soft bit data may be read by, for example, using the normal read operation and changing the sense timing only for the soft bit read.

Furthermore, reads at levels AR, BR, and CR and a soft bit read at the respective levels may be carried out at the level of one word line or several word lines.

A parameter is set for each sense timing and stored in a chip.

When both the normal read and the soft bit read are carried out, a slight deviation may occur between the normal read and the soft bit read but soft values including the deviation are subjected to ECC.

(Second Embodiment)

Figure 16:
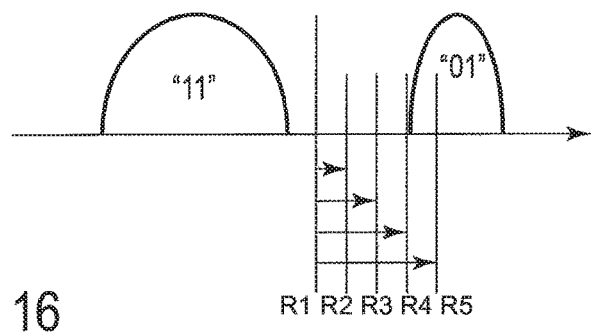
FIG. 16 is a diagram showing an example of a manner of determining an optimum read level.

As shown in FIG. 16, to allow the optimum read level R to be determined, a method has been proposed which involves changing the read level of the word line little by little (read levels R1 to R5), searching for an end of the threshold voltage distribution of data patterns stored (e.g., "11" or "01"), determining the optimum read level R, and then performing a read operation. However, this method disadvantageously takes a long time because the read level is changed little by little.

Figure 17:
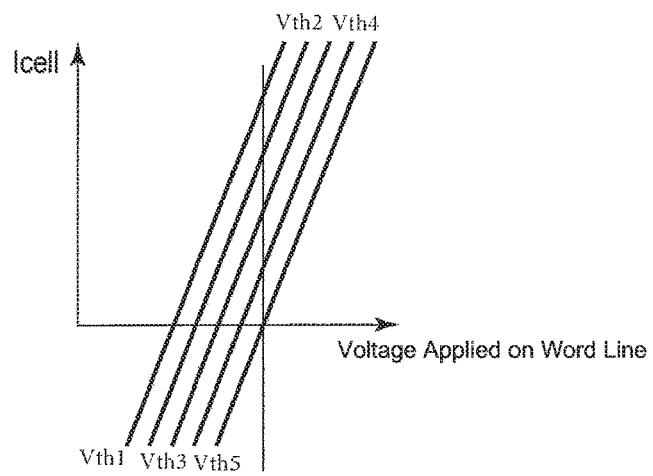
FIG. 17 is a diagram showing an example of a manner of determining the optimum read level according to a second embodiment.

FIG. 17 shows relationships between a current (Icell) flowing through each of memory cells and a voltage applied on the word line of each of the memory cells. Herein, the memory cells have threshold voltages Vth1 to Vth5 (Vth1<Vth2<Vth3<Vth4<Vth5), respectively. FIG. 17 shows that when the voltage level R is applied to a word line, a large current will flow through the memory cell having a low threshold voltage, and a small current will flow through the memory cell having a high threshold voltage. The memory cells are distributed depending on the value of the current (Icell) flowing through the memory cells. In this way, each end of the threshold voltage distribution, i.e. the optimum read-out level, can be determined. Thus, as shown in FIG. 17, the second embodiment uses, as a word line potential, one level or several levels based on the number of threshold voltage distributions, and like the first embodiment, changing, during a read operation at each word line potential, the sense timing of the sense amplifier with respect to the discharge time for the bit line to search for the end of the threshold voltage distribution. That is, the potential of the bit line is detected with the sense timing changed, and as shown in FIG. 17, the end of the threshold voltage distribution is searched for based on the timing when the current starts increasing. The optimum read voltage is determined to be the searched-for threshold voltage +α, that is, the threshold voltage plus an offset.

The second embodiment allows the optimum read level to be determined for each threshold voltage distribution. The second embodiment further eliminates having to perform a plurality of read operations with the word line level changed by setting a potential higher or lower than the potential of each word line. This enables the optimum read level to be searched for at high speed.

The read operation at a plurality of levels is effective for enabling the optimum read level to be determined to be the smallest value of the aggregated numbers of bit memory cells or the smallest value plus an offset.

(Modification)

The second embodiment changes the sense timing a plurality of times as shown in FIG. 14. An interval of time must be provided between the sense timings to achieve stability. This may hinder short timing intervals from being set.

The present embodiment searches for the end of the threshold voltage distribution. For example, when the page is 16 KB in size, the present embodiment enables the end of the distribution to be searched for based on, for example, 1-KB distribution data without having to search the distribution of all of 16-KB data. Thus, the end of the threshold voltage distribution may be searched for by dividing a plurality of bit lines shown in FIG. 2 or FIG. 3 into a plurality of groups and varying the sense timing among the groups.

Figure 19:
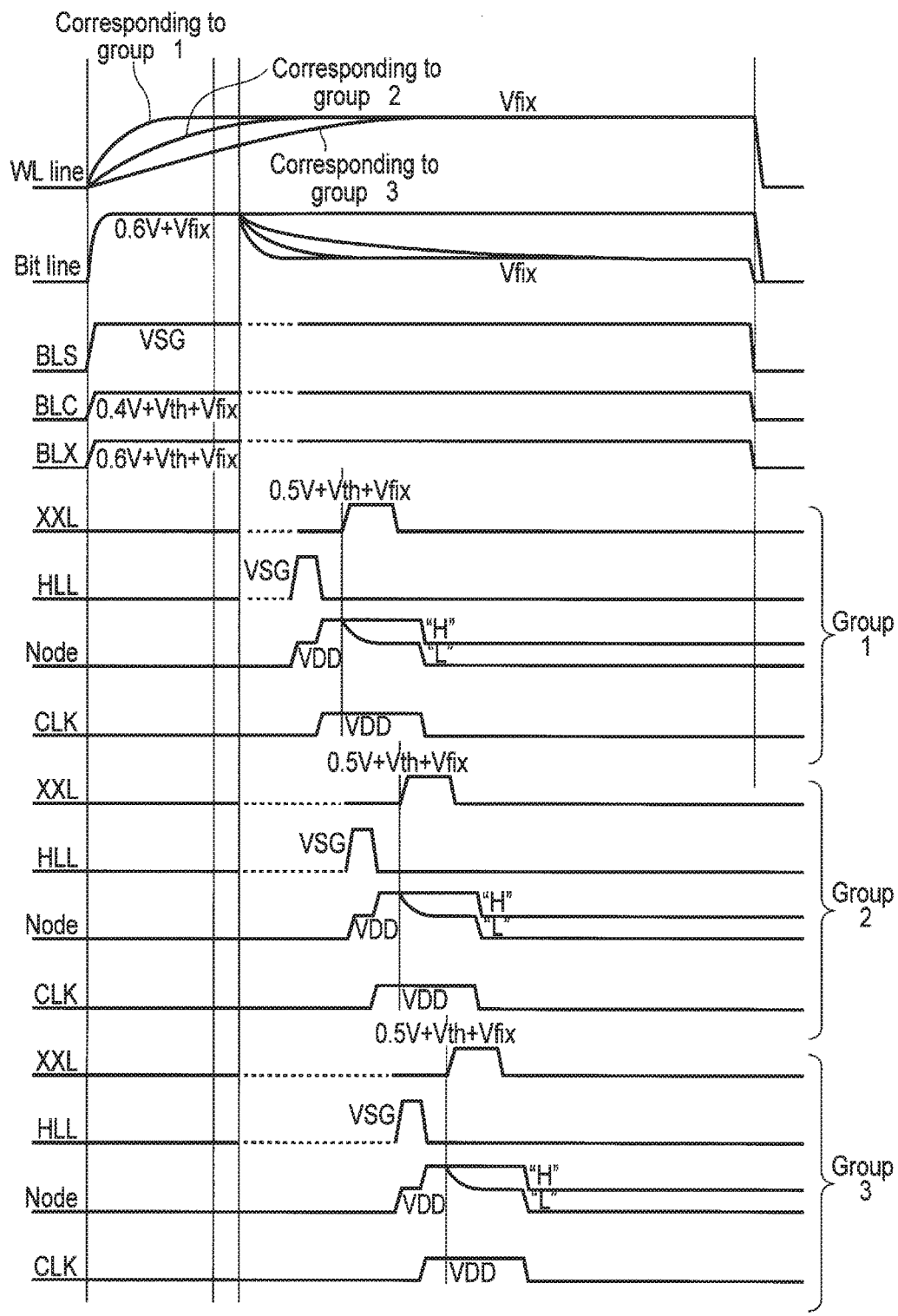
FIG. 19 is a timing chart showing a modification of the second embodiment.

FIG. 19 is a timing chart showing a modification of the second embodiment. As shown in FIG. 19, the bit lines are divided into a plurality of groups, group 1, group 2, group 3, . . . , and the sense timing is varied among the groups. Then, the end of the distribution can be searched for based on, for example, 1-KB distribution data.

Furthermore, a cell close to a word line drive circuit involves a shorter time until the sense timing is stabilized, than a cell remote from the word line drive circuit because the corresponding word line rises earlier. Thus, NAND units may be divided into a plurality of groups depending on the distance from the word line drive circuit to the corresponding bit line, and the end of the threshold voltage distribution may be searched for each group. Of course, also in this case, the sense timing may be varied among the groups or the rise time of the word line may be set later than usual in order to change the sense timing.

Furthermore, the second embodiment changes the read level of the word line little by little in order to determine the optimum read level and changes the sense timing a plurality of times to search for the end of the threshold voltage distribution. At this time, data read at each read level of the word line or sense timing may be output to, for example, a controller located externally to the NAND flash memory so that the controller can process the data. However, the time required to externally output the data may pose a problem.

In this case, as shown in FIG. 20, a cache function may be utilized such that while the results of a read at the first word line level or sense timing are being externally output, a read is performed at the next, second word line level or sense timing.

Alternatively, externally outputting the read results may be avoided, and a counter may be provided inside the NAND flash memory to count the read results inside the chip and to output only the count result externally to the chip.

Alternatively, externally outputting the count result may be avoided, and the count result may be held inside the chip so that the optimum read level can be automatically set based on the read results for a plurality of word line levels or sense timings.

Furthermore, if the counter inside the NAND flash memory is used for counting, the counting is carried out for every bit to every several bits and may thus take a long time.

In this case, as shown in FIG. 21, a cache function may be utilized such that while the read results are being counted at the first word line level or sense timing, a read can be performed at the next, second word line level or sense timing.

(Third Embodiment)

Figure 18:
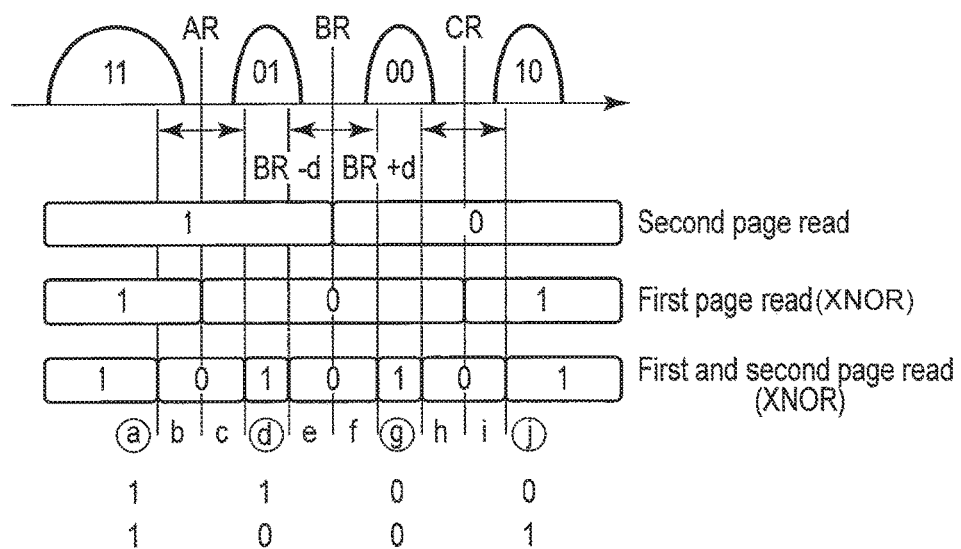
FIG. 18 is a diagram showing relationships between first page read data and second page read data and soft bit read data according to a third embodiment.

FIG. 18 shows a memory cell and relationships between data read by the first page read and data read by second page read and data read by a soft bit read. Three-bit data is output based on the threshold levels a to j of the memory cell. However, the main distribution of the memory cell to which data has been written is present in a, d, g, and j. Consequently, a read operation often allows these data to be output. Thus, the data corresponding to a, d, g, and j is expressed mainly as two bits, and the other data is expressed as three bits or four bits.

The third embodiment expresses the data corresponding to the main distribution a, d, g, and j as two bits and expresses the other data as three bits or four bits, enabling a reduction in total output data.

The first and second embodiments change the sense timing to obtain data corresponding to reads at a plurality of word line levels as shown in FIG. 13 and FIG. 17, respectively. However, for the NAND flash memory, it is known that the cell current (Icell) decreases with increasing number of erase and write times.

The reduced cell current can be increased by raising the level of the bit line during a read. Thus, when the reduced cell current is to be avoided, a region is provided in which the number of erase loops is stored for each block that is an erase unit. When erase is carried out, the number of erases is stored in this region. Subsequently, during a read or program operation, the cell current can be increased by reading the number of erases stored in this region, and changing the level of the bit line for a read and program verify read depending on the read number of erases.

Of course, the level of the bit line for a read based on the number of erases can be used for a normal read and program verify read, which are different from the soft bit read according to the first embodiment and the search for the end of the threshold voltage distribution according to the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array comprising memory cells arranged in a matrix, each of the memory cells connected to each of word lines and each of bit lines;
a sense amplifier connected to the bit lines and configured to detect a voltage of the bit lines; and
a control circuit configured to control potentials of the word lines and the bit lines,
wherein:
the control circuit divides the bit lines into a first group and a second group based on distances of the bit lines to a drive circuit of the word lines, the second group being farther away from the drive circuit than the first group, and
in a read, in which memory cells connected to the bit lines of the first group and memory cells connected to the bit lines of the second group are simultaneously read, the control circuit senses the first group at a first timing and senses the second group at a second timing when a given voltage is applied to an elected word line, the second timing being later than the first timing, by a period shorter than a clock cycle.

2. The device of claim 1, wherein based on results read from each of the first and second groups, optimum read levels are determined for each threshold voltage distribution.

3. The device of claim 1, wherein the given voltage at the first timing is a first voltage and the given voltage at the second timing is the first voltage.

4. The device of claim 1, wherein the control circuit outputs data obtained by sensing the first and second groups to an external controller, and the data obtained by sensing the first and second groups is processed by the external controller.

5. The device of claim 1, wherein the control circuit counts data obtained by sensing the first and second groups, and outputs a count result.

6. The device of claim 1, wherein the control circuit counts data obtained by sensing the first and second groups, holds a count result, and automatically sets a read level based on the held count result.

7. The device of claim 1, wherein at least one of the memory cells connected to the bit lines of the first group has a first threshold voltage and at least one of the memory cells connected to the bit lines of the second group has the first threshold voltage.

8. The device of claim 1, wherein the memory cells in the memory cell array have a plurality of threshold voltages, and the memory cells connected to the bit lines of the first group have all of the plurality of threshold voltages.

9. The device of claim 1, wherein the control circuit senses the first group without sensing the second group at the first timing and senses the second group without sensing the first group at the second timing.

10. The device of claim 1, wherein the memory cells in the memory cell array have threshold voltage distributions, and the control circuit searches an end of one of the threshold voltage distributions by sensing the first group and the second group.

11. A semiconductor memory device comprising:
a memory cell array comprising memory cells arranged in a matrix, each of the memory cells connected to each of word lines and each of bit lines;
a sense amplifier connected to the bit lines to detect a voltage of the bit lines; and
a control circuit configured to control potentials of the word lines and the bit lines,
wherein:
the control circuit divides the bit lines into a first group and a second group based on distances of the bit lines to a drive circuit of the word lines, the second group being farther away from the drive circuit than the first group, and
in a read, in which memory cells connected to the bit lines of the first group and memory cells connected to the bit lines of the second group are simultaneously read, the control circuit senses the first and second groups at different timings, a difference between the timings being shorter than a clock cycle, wherein a word line elected by a voltage application has different rise times for the first and second groups.

12. The device of claim 11, wherein based on results read from each of the first and second groups, optimum read levels are determined for each threshold voltage distribution.

13. The device of claim 11, wherein at least one of the memory cells connected to the bit lines of the first group has a first threshold voltage and at least one of the memory cells connected to the bit lines of the second group has the first threshold voltage.

14. The device of claim 11, wherein the memory cells in the memory cell array have a plurality of threshold voltages, and the memory cells connected to the bit lines of the first group have all of the plurality of threshold voltages.

* * * * *